United States Patent
Nolles et al.

(10) Patent No.: US 6,836,866 B2
(45) Date of Patent: Dec. 28, 2004

(54) CIRCUIT INCLUDING A BUILT-IN SELF-TEST

(75) Inventors: Jürgen Nolles, München (DE); Gerd Dirscherl, München (DE); Wolfgang Gärtner, München (DE)

(73) Assignee: Infineon Technologies AG, Munich (DE)

( * ) Notice: Subject to any disclaimer, the term of this patent is extended or adjusted under 35 U.S.C. 154(b) by 394 days.

(21) Appl. No.: 10/007,391

(22) Filed: Oct. 22, 2001

(65) Prior Publication Data

US 2002/0104052 A1 Aug. 1, 2002

Related U.S. Application Data

(63) Continuation of application No. PCT/DE00/01052, filed on Apr. 5, 2000.

(30) Foreign Application Priority Data

Apr. 20, 1999 (DE) .......................................... 199 17 884

(51) Int. Cl.[7] .............................................. G01R 31/28
(52) U.S. Cl. ...................................... 714/733; 714/728
(58) Field of Search ................................ 714/733, 734, 714/728, 724, 726, 739, 742

(56) References Cited

U.S. PATENT DOCUMENTS

| 5,383,195 | A | | 1/1995 | Spence et al. |
| 5,416,783 | A | | 5/1995 | Broseghini et al. |
| 5,764,655 | A | * | 6/1998 | Kirihata et al. ............. 714/733 |
| 5,872,793 | A | | 2/1999 | Attaway et al. |
| 5,923,836 | A | * | 7/1999 | Barch et al. .................. 714/33 |
| 6,311,300 | B1 | * | 10/2001 | Omura et al. ............... 714/724 |
| 6,587,979 | B1 | * | 7/2003 | Kraus et al. ................ 714/720 |

FOREIGN PATENT DOCUMENTS

JP 6-27200 2/1994

OTHER PUBLICATIONS

"Automated BIST for Sequential Logic Synthesis", Charles E. Stroud, IEEE Design & Test of Computers, 1988, pp. 22–32.

* cited by examiner

*Primary Examiner*—Guy J. Lamarre
*Assistant Examiner*—James C. Kerveros
(74) *Attorney, Agent, or Firm*—Laurence A. Greenberg; Werner H. Stemer; Ralph E. Locher

(57) ABSTRACT

A circuit includes a built-in self-test, wherein the test coverage of a tested logic circuit is improved given the utilization of a fixed standard interface. Besides a direct interface, the complex circuit has an additional indirect interface, which connects a structural test device to a functional circuit.

14 Claims, 3 Drawing Sheets

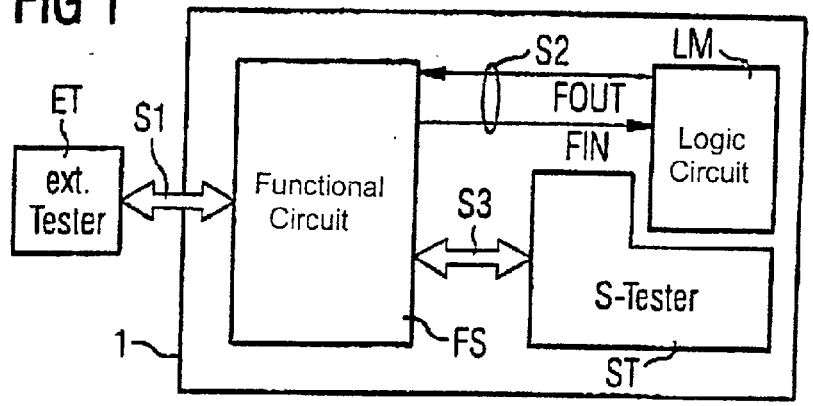
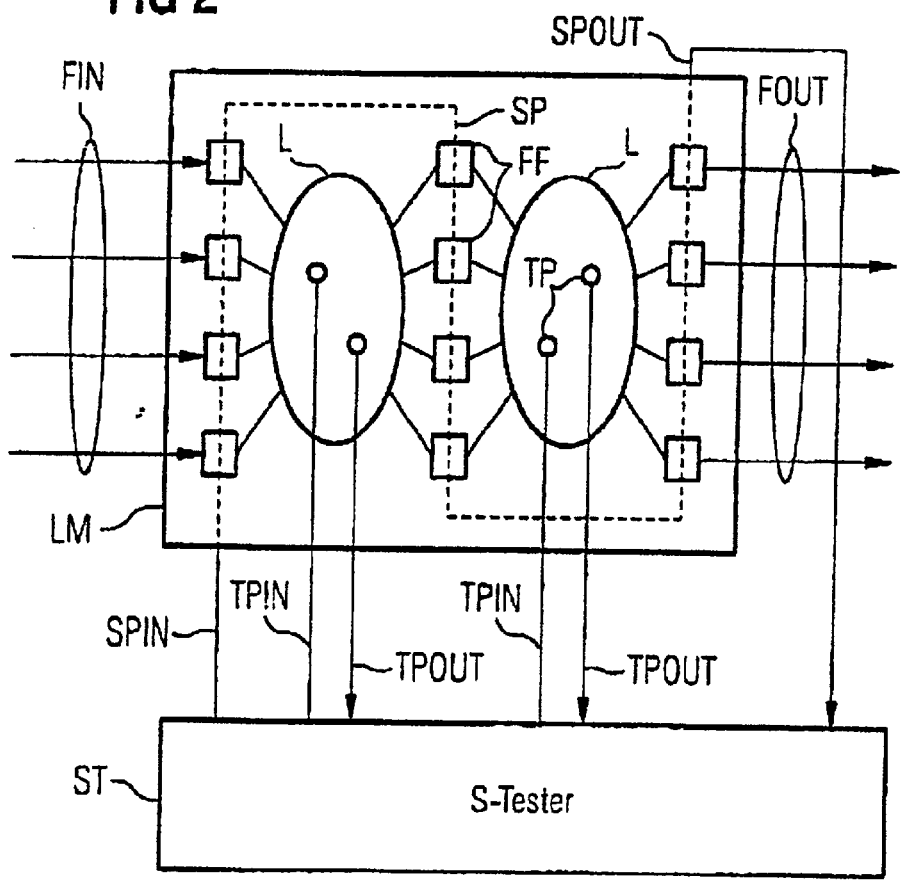

CIRCUIT INCLUDING A BUILT-IN SELF-TEST

CROSS-REFERENCE TO RELATED APPLICATION

This application is a continuation of copending International Application No. PCT/DE00/01052, filed Apr. 5, 2000, which designated the United States.

BACKGROUND OF THE INVENTION

Field of the Invention

The invention lies in the field of integrated circuits. The invention relates to a circuit including a built-in self-test, particularly, an integrated circuit in a chip card having improved testing capabilities.

Particularly for the logical testing of integrated circuits, conventional software tests are utilized for functional testing, or hardware tests are utilized for structural testing.

FIG. 4 is a schematic block circuit diagram of a prior art testing configuration for testing a complex circuit 1 with a conventional software test. In FIG. 4, the reference character ET refers to an external testing device that is in contact with the tested complex circuit 1 through a standard interface S1. The complex circuit 1 substantially includes a functional circuit FS, which serves, on one hand, for actuating an actual logic circuit LM, and, on the other hand, for the functional testing of the logic circuit LM. The functional circuit FS is connected to the logic circuit LM actually being tested through a direct interface S2, which essentially represents a connection to the inputs and outputs of the logic circuit LM. Typically, a test access through such a direct interface S2 occurs only through registers, for which reason it is also referred to as a "software interface" or a "register interface". To test the complex circuit 1, the external testing device ET sends a variety of test data across the standard interface S1 to the functional circuit FS, which performs a functional test of the logic circuit LM through the direct interface S2.

The disadvantage of such a conventional software test, wherein it is only possible to perform a functional test of the logic circuit LM, is the relatively small test coverage of approximately 60 to 70 percent. The coverage is essentially due to the fact that particular internal areas of the logic circuit LM cannot be reached by the conventional functional test.

Thus, to improve the test coverage, hardware tests have been developed, which are represented in FIG. 5 and FIG. 6.

FIG. 5 is a schematic block diagram of another conventional prior art test configuration, with which it is possible to perform a structural test of a circuit by what is referred to as a hardware test. According to FIG. 5, the complex circuit 1 being tested substantially includes a logic circuit LM that is in contact with the outside environment through a standard interface S1. In contrast to the functional test represented in FIG. 4, in which the test is performed over the standard interface S1, the test configuration represented in FIG. 5 additionally has a structural interface SS, which makes possible a structural testing of the logic circuit LM. To realize the structural interface SS, five additional terminal lines are usually required, which include an input and output terminal, a timing and control terminal, and a terminal for activating and deactivating the structural interface SS. The structural interface SS leads into internal areas of the logic circuit LM, making it possible to also reach the logic areas that are difficult to access for a conventional functional test. In the conventional test as represented in FIG. 5, optimized test patterns with respect to the specific technical characteristics of the logic circuit LM are calculated and fed to the logic circuit LM by the external test device ET by way of the structural interface SS. The response of the logic circuit LM to the test pattern is fed to the external test device by way of the structural interface SS and is processed there. As such, an extraordinarily high test coverage of up to 100% can be obtained by a small number of optimized test patterns.

A disadvantage of such a conventional testing technique is the additional structural interface SS, which, on one hand, poses security problems in sensitive circuits, and, on the other hand, represents additional hardware for operating the complex circuit 1. Furthermore, a larger area is consumed by the complex circuit 1 for the hardware test.

FIG. 6 represents a schematic block diagram of a separate conventional prior art test configuration, wherein what is referred to as a Built-In Self-Test (BIST) is utilized to reduce the computing expenditure for determining the optimized test pattern as represented in FIG. 5. The conventional test configuration represented in FIG. 6 substantially corresponds to the conventional test configuration represented in FIG. 5, but the complex circuit 1 includes a built-in self-test (BIST) as the structural testing device ST. A standard interface S1 is utilized to operate the logic circuit LM in such a case, also, while the built-in structural testing device ST is in contact with an external testing device ET by way of a simplified structural interface SS'. The BIST used in FIG. 6 usually includes what is referred to as a pseudo-random number generator for the high-speed generation of test patterns. In an extremely simple fashion, the pseudo-random number generator generates a plurality of test patterns that are fed to the tested logic circuit LM by way of internal access points (scan path and/or test points), and the corresponding result test patterns are evaluated. The result vectors are expediently compressed in a non-illustrated signature register, and the signatures so obtained are compared to a desired value. Unlike the testing configuration represented in FIG. 5, these test patterns that are generated by the pseudo-random number generator are not optimal with respect to the logic circuit LM, and, therefore, have a typical test coverage of approximately 80 percent.

Besides the smaller test coverage, the existence of the additional structural interface SS' is also disadvantageous because it similarly represents a security problem and requires an extraordinarily large area for the additional hardware (BIST) in the complex circuit 1, which area amounts to up to 10 percent of the total space required for the complex circuit 1.

Particularly in integrated circuits that are used in what are referred to as chip cards, the number of external terminals and interfaces represents a significant problem. Specifically, such chip cards already have a fixed standard interface including a fixed number of terminals, which cannot be modified. Furthermore, particularly in what are referred to as money cards, providing an additional interface creates an unacceptable security risk because unauthorized manipulations must be reliably deactivated at the actual logic circuit.

SUMMARY OF THE INVENTION

It is accordingly an object of the invention to provide a circuit including a built-in self-test that overcomes the hereinafore-mentioned disadvantages of the heretofore-known devices of this general type and that makes possible an easy improvement of the test coverage of a circuit given the utilization of a fixed external interface.

With the foregoing and other objects in view, there is provided, in accordance with the invention, a built-in self-test circuit to be connected to an external device, the circuit including a logic circuit having a structure to be tested, a structural testing device for testing the structure of the logic circuit, a functional circuit connected to the structural testing device through an indirect interface, the functional circuit driving the logic circuit through a direct interface; the functional circuit receiving test commands from an external device through a standard interface, and the functional circuit at least partially forwarding the test commands to the indirect interface for indirectly driving the logic circuit.

In particular, it is possible to improve the test coverage for a tested logic circuit without utilizing an additional external interface by utilizing a structural testing device and an indirect interface for connecting the structural testing device to a functional circuit of the complex circuit.

Expediently, in accordance with another feature of the invention, the structural testing device has a scan path and/or a test point located directly in the logic circuit being tested. As such, it is also possible to test logic areas that can be reached only with great difficulty, if at all, by purely functional tests. The structural testing device can utilize optimized vectors or pseudo-random vectors as test patterns. Thus, the degree of test coverage can be variably adjusted up to nearly 100 percent.

In accordance with a further feature of the invention, the functional circuit stores test patterns in the form of vectors optimized to the logic circuit tested, and the structural testing device utilizes the test patterns.

In accordance with an added feature of the invention, the external device loads the test patterns through the standard interface.

In accordance with an additional feature of the invention, the structural testing device includes a test pattern generator for generating a test pattern in the form of pseudo-random vectors.

As test patterns, the structural testing device expediently utilizes pseudo-random vectors with a test coverage of approximately 80 percent, whereby the remaining up to 20 percent coverage is realized by a functional test. As such, an extraordinarily large test coverage is provided in a particularly simple and cost-effective manner.

In accordance with yet another feature of the invention, the functional circuit includes a functional testing device for functionally testing the logic circuit through the direct interface.

In accordance with yet a further feature of the invention, the functional testing device performs a functional test based upon a simulation result for the structural test device and the logic circuit.

In accordance with yet an added feature of the invention, the functional circuit includes software, and the structural testing device has a part realized as a portion of the software in the functional circuit.

In accordance with again another feature of the invention, the logic circuit tested includes logic modules. The tested logic circuit expediently includes a plurality of logic modules that are controlled by the same structural test device so that additional space is saved and the test configuration is further simplified.

In accordance with again a further feature of the invention, the functional circuit selects at least one of the logic modules for testing.

In accordance with again an added feature of the invention, the standard interface is a contactless interface.

With the objects of the invention in view, there is also provided a built-in self-test circuit to be connected to an external device, the circuit including a logic circuit having a structure to be tested, a structural testing device for testing the structure of the logic circuit, a functional circuit having a standard interface connecting the functional circuit to an external device transmitting test commands, the functional circuit receiving the test commands through the standard interface, an indirect interface for indirectly driving the logic circuit, the indirect interface connecting the functional circuit to the structural testing device, a direct interface connecting the functional circuit to the logic circuit, the functional circuit driving the logic circuit through the direct interface, and the functional circuit at least partially forwarding the test commands to the indirect interface.

With the objects of the invention in view, in a chip card there is also provided an integrated circuit including a built-in self-test circuit to be connected to an external device. The built-in self-test circuit has a logic circuit having a structure to be tested, a structural testing device for testing the structure of the logic circuit, and a functional circuit connected to the structural testing device through an indirect interface. The functional circuit drives the logic circuit through a direct interface. The functional circuit receives test commands from an external device through a standard interface. The functional circuit at least partially forwards the test commands to the indirect interface for indirectly driving the logic circuit.

Other features that are considered as characteristic for the invention are set forth in the appended claims.

Although the invention is illustrated and described herein as embodied in a circuit including a built-in self-test, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a block circuit diagram of a test configuration according to the invention;

FIG. 2 is a block circuit diagram of a structural test device of FIG. 1 in contact with a tested logic circuit;

DESCRIPTION OF THE PREFERRED EMBODIMENTS

Figure 3:
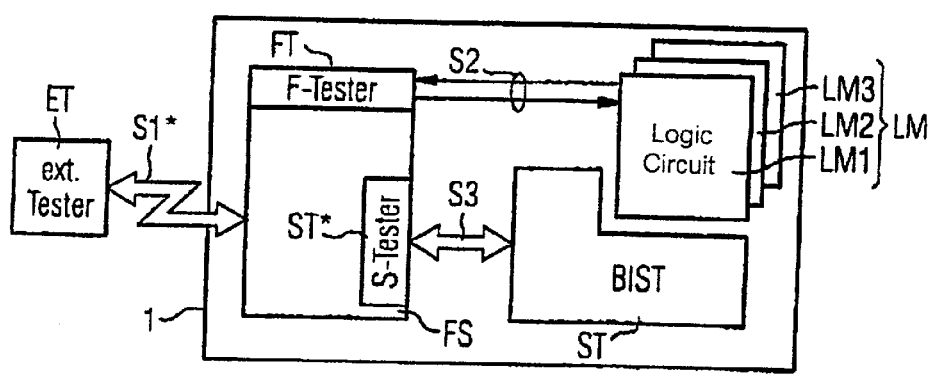
FIG. 3 is a block circuit diagram of an alternative embodiment of the test configuration of FIG. 1.
Figure 4:
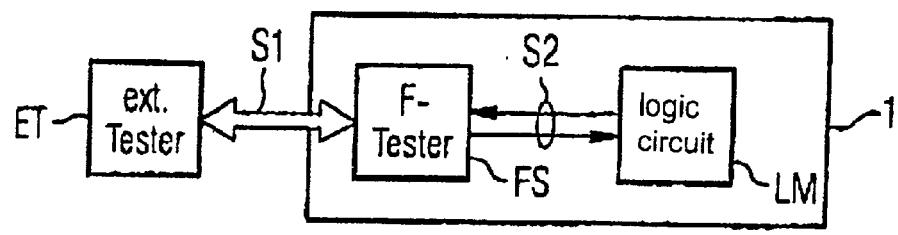
FIG. 4 is a block circuit diagram of a prior art test configuration.
Figure 5:
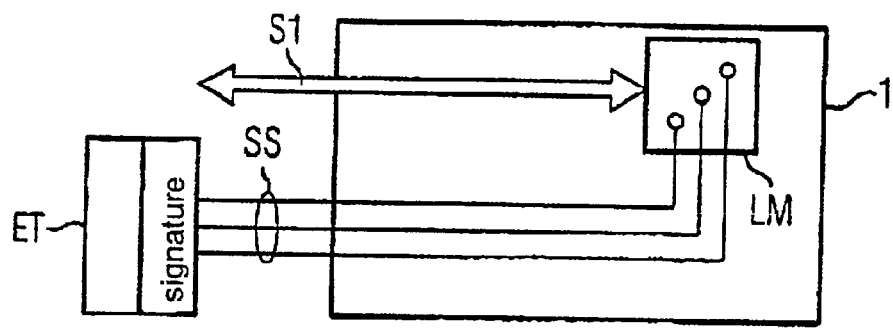
FIG. 5 is a block circuit diagram of another prior art test configuration.
Figure 6:
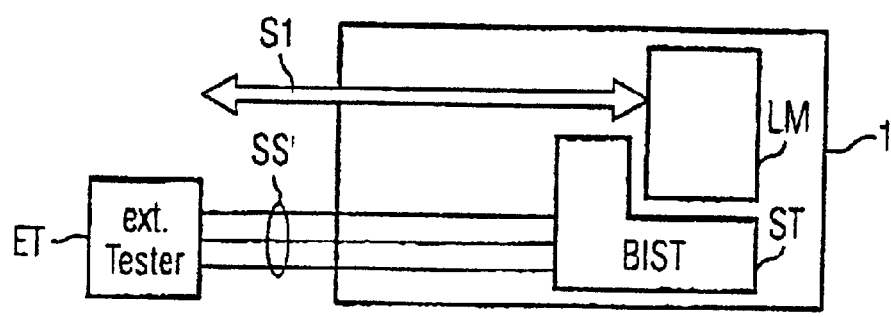
FIG. 6 is a block circuit diagram of yet another prior art test configuration.

Referring now to the figures of the drawings in detail and first, particularly to FIG. 1 thereof, there is shown a block circuit diagram of a test configuration including an external test device ET and a complex circuit 1, which represents an integrated circuit in what is referred to as a chip card, for example. The complex circuit 1 contains a functional circuit FS, a structural test device ST, and a logic circuit LM. The functional circuit FS substantially includes software that is processed by a microprocessor (CPU, etc.), for example. The microprocessor is likewise tested by the functional circuit FS (software) and, therefore, is allocated to the block of the logic circuit LM in FIG. 1. The complex circuit 1 further includes a fixed standard interface S1, through which it is in contact with non-illustrated external devices. In chip cards, the standard interface S1 substantially includes five busy terminal lines that have a fixed functional allocation. The configuration guarantees compatibility with a plurality of external write/read devices. Given that the data stored on chip cards are often related to security, it is necessary to optimally prevent manipulation of these security-related data, and, therefore, direct access to the actual logic circuit LM must be ruled out.

The complex circuit 1 has an indirect interface S3 for such a purpose, which connects the functional circuit FS to the structural test device ST. For instance, if a test for the logic circuit LM is requested by the external test device ET through the standard interface S1 in the functional circuit FS, the test request is forwarded in accordance with FIG. 1 through the indirect interface S3 to the structural test device ST, which performs a structural test of the logic circuit LM and returns the test result to the functional circuit FS by way of the indirect interface S3. The functional circuit FS then delivers the test result to the external test device ET through the standard interface S1. Alternatively, if the complex circuit 1 is connected to a non-illustrated external write/read device, the write/read data that are transferred through the standard interface S1 are redirected by the functional circuit FS to the direct interface S2 and processed by the logic circuit LM in the usual manner.

In particular, by utilizing the functional circuit FS as an interface converter between the fixed external standard interface S1 and the internal direct interface S2 and/or indirect interface S3, and also utilizing a structural test device ST, a circuit 1 with a built-in self-test is achieved, with which an improved test coverage is possible, given the utilization of the external standard interface S1.

FIG. 2 represents a schematic block diagram of the structural test device ST in contact with the logic circuit LM that is actually being tested. The reference characters FIN and FOUT in FIG. 2 reference the input/output terminals of the logic circuit LM, which represent the direct interface S2. The direct interface S2, that is, FIN/FOUT, is expediently a matter of a software interface that enables access to the tested logic circuit LM only through registers of the functional circuit FS. The logic circuit LM also substantially includes logic areas L that are in contact with one another and with the direct interface S2 (FIN/FOUT) by way of flip-flops FF. To perform a structural test, the flip-flops FF of the logic circuit LM are exemplarily connected through a scan path SP. The scan path SP contains an input SPIN and an output SPOUT, which are connected to the structural test device ST. Thus, the structural test device ST can write its test patterns into internal logic areas through the scan path SP and can read corresponding test results from these areas, thereby improving the test coverage to an extraordinary degree. As an alternative to these scan paths SP, test points TP that are located directly in the tested logic areas L can be actuated directly by the structural test device ST. The test patterns are thereby supplied to the logic areas L by the structural test device ST by way of test point inputs TPIN, and a corresponding test result is read by way of test point outputs TPOUT. The configuration achieves improved test coverage for the logic circuit LM being tested. Furthermore, in order to achieve a further improvement of the test coverage, it is also possible to utilize a combination of scan paths SP and test points TP to test the logic circuit LM.

The structural test device represented in FIGS. 1 and 2 can utilize qualitatively different test patterns to test the logic circuit LM. These test patterns can include a small number of specially calculated (optimized) test vectors, which are specifically optimized in consideration of the logic circuit LM, the structural test device ST, and the scan path SP and test points TP. The advantage of test vectors such as these is that they have a test coverage of nearly one hundred percent for the tested logic circuit LM. These optimized test vectors can be stored in the functional circuit and made available by way of the indirect interface S3, but can also be loaded, individually or in packets, from the external test device ET into the functional circuit FS across the standard interface S1 and subsequently applied to the logic circuit LM. As such, the logic circuit LM can be tested particularly effectively at a later time with the aid of optimized test vectors.

Alternatively, however, the structural test device can also utilize what are referred to as pseudo-random vectors, which are generated by a relatively easily realized non-illustrated pseudo-random number generator in the structural test device ST, which generates an extraordinarily large set of pseudo-random test vectors. Such pseudo-random number generators are utilized in what are referred to as built-in self tests (BISTs). However, due to their unoptimized structure, such pseudo-random vectors have a typical test coverage of only approximately 80 percent.

FIG. 3 is a block circuit diagram of a test configuration according to a second exemplifying embodiment, wherein such a BIST that includes a pseudo-random number generator is utilized for the structural test device ST.

To improve the test coverage with such a BIST (approximately 80 percent), the circuit of the structural test device ST can be simulated together with the logic circuit LM, and the remaining approximately 20 percent coverage that is still missing can be qualitatively localized. Based on such a simulation result, a functional test can then be generated as a software test and applied in the functional circuit FS. The character FT references such a functional test device, which performs a purposeful functional test of the remaining approximately 20 percent by way of the direct interface S2. As such, the test coverage is further improved by combining the structural test device ST with a functional test device FT.

According to FIG. 3, parts of the structural test device ST in the functional circuit FS can also be swapped out and realized as software. Such swapped parts of the structural test device ST are referenced ST* in FIG. 3, whereby the swapped structural test part ST* is in contact with the structural test device ST by way of the indirect interface S3. The test durations are an example of such swapped structural test parts ST*, whereby a hardware counter is replaced by a software loop in the functional circuit FS. Furthermore, the desired-value/actual-value comparator that is provided in the structural test device ST can be realized by a software comparison in the functional circuit FS. Theoretically, all BIST functions, including the actual scan path SP and test points TP, are realizable as software in the structural test part ST* of the functional circuit FS, thereby saving space for the complex circuit 1.

Furthermore, the logic circuit LM according to FIG. 3 can include a plurality of logic modules LM1, LM2, LM3, whereby a single structural test device ST is utilized for all tested logic modules LM1, LM2, and LM3. Different logic modules can be tested particularly easily when a BIST with a pseudo-random number generator, in particular, is utilized. The functional circuit FS expediently selects a respective logic module for which a test is to be performed. As such, it is also possible to test two or more logic modules LM1, LM2 and LM3 in parallel fashion.

Furthermore, according to FIG. 3 a contactless standard interface S1* can be utilized as the standard interface for transferring the data to an external device ET, whereby the complex circuit 1 additionally includes a non-illustrated transmission/reception device for driving the contactless standard interface S1*.

The invention has been described in the example of an integrated circuit in a chip card. However, the invention is not limited to such an embodiment and can be applied to all complex circuits that include a fixed standard interface and require a self-test with improved coverage.

We claim:

1. A built-in self-test circuit to be connected to an external device, the circuit comprising:
    a logic circuit having a structure to be tested;
    a structural testing device for testing said structure of said logic circuit;
    a functional circuit connected to said structural testing device through an indirect interface, said functional circuit driving said logic circuit through a direct interface; said functional circuit receiving test commands from the external device through a standard interface; and
    said functional circuit at least partially forwarding the test commands to said indirect interface for indirectly driving said logic circuit.

2. The circuit according to claim 1, wherein said structural testing device includes one of the group consisting of a scan path and test points in said logic circuit tested.

3. The circuit according to claim 1, wherein:
    said functional circuit stores test patterns in the form of vectors optimized to said logic circuit tested; and
    said structural testing device utilizes said test patterns.

4. The circuit according to claim 3, wherein the external device loads said test patterns through the standard interface.

5. The circuit according to claim 1, wherein said structural testing device includes a test pattern generator for generating a test pattern in the form of pseudo-random vectors.

6. The circuit according to claim 5, wherein:
    said functional circuit includes software; and said structural testing device has a part realized as a portion of said software in said functional circuit.

7. The circuit according to claim 1, wherein said functional circuit includes a functional testing device for functionally testing said logic circuit through said direct interface.

8. The circuit according to claim 7, wherein said functional testing device performs a functional test based upon a simulation result for said structural test device and said logic circuit.
    said structural testing device has a part realized as a portion of said software in said functional circuit.

9. The circuit according to claim 1, wherein said logic circuit tested includes logic modules.

10. The circuit according to claim 9, wherein said functional circuit selects at least one of said logic modules for testing.

11. The circuit according to claim 9, wherein said functional circuit tests at least one of said logic modules.

12. The circuit according to claim 1, wherein the standard interface is a contactless interface.

13. In a chip card, an integrated circuit comprising:
    a built-in self-test circuit to be connected to an external device, said built-in self-test circuit having:
        a logic circuit having a structure to be tested;
        a structural testing device for testing said structure of said logic circuit;
        a functional circuit connected to said structural testing device through an indirect interface, said functional circuit driving said logic circuit through a direct interface; said functional circuit receiving test commands from the external device through a standard interface; and
        said functional circuit at least partially forwarding the test commands to said indirect interface for indirectly driving said logic circuit.

14. A built-in self-test circuit to be connected to an external device, the circuit comprising:
    a logic circuit having a structure to be tested;
    a structural testing device for testing said structure of said logic circuit;
    a functional circuit having a standard interface connecting said functional circuit to the external device transmitting test commands, said functional circuit receiving the test commands through said standard interface;
    an indirect interface for indirectly driving said logic circuit, said indirect interface connecting said functional circuit to said structural testing device;
    a direct interface connecting said functional circuit to said logic circuit, said functional circuit driving said logic circuit through said direct interface; and
    said functional circuit at least partially forwarding the test commands to said indirect interface.

* * * * *